United States Patent
Vashchenko

(10) Patent No.: US 7,411,251 B1
(45) Date of Patent: Aug. 12, 2008

(54) SELF PROTECTING NLDMOS, DMOS AND EXTENDED VOLTAGE NMOS DEVICES

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 152 days.

(21) Appl. No.: 11/155,087

(22) Filed: Jun. 17, 2005

(51) Int. Cl.
*H01L 23/62* (2006.01)
*H01L 21/4763* (2006.01)

(52) U.S. Cl. .............. 257/360; 257/E29.021; 438/286; 438/586

(58) Field of Classification Search .............. 438/234, 438/236–238, 381, 286, 586; 257/355, 362, 257/360, E29.021
See application file for complete search history.

(56) References Cited

U.S. PATENT DOCUMENTS

| | | | | |
|---|---|---|---|---|
| 5,508,547 A | * | 4/1996 | Yang | 257/343 |
| 5,592,005 A | * | 1/1997 | Floyd et al. | 257/331 |
| 5,767,550 A | * | 6/1998 | Calafut et al. | 257/355 |
| 5,804,860 A | * | 9/1998 | Amerasekera | 257/361 |
| 6,589,833 B2 | * | 7/2003 | Hu et al. | 438/208 |
| 6,657,241 B1 | * | 12/2003 | Rouse et al. | 257/173 |
| 7,057,215 B1 | * | 6/2006 | Vashchenko et al. | 257/173 |
| 7,115,951 B1 | * | 10/2006 | Vashchenko et al. | 257/355 |
| 2002/0076876 A1 | * | 6/2002 | Ker et al. | 438/218 |
| 2004/0173859 A1 | * | 9/2004 | Hao et al. | 257/408 |
| 2006/0186467 A1 | * | 8/2006 | Pendharkar et al. | 257/337 |
| 2006/0202265 A1 | * | 9/2006 | Xu et al. | 257/335 |
| 2006/0284258 A1 | * | 12/2006 | Huang et al. | 257/356 |

* cited by examiner

*Primary Examiner*—M. Wilczewski
*Assistant Examiner*—Toniae M. Thomas
(74) *Attorney, Agent, or Firm*—Jurgen Vollrath

(57) ABSTRACT

In an NLDMOS, DMOS or NMOS active device the ability to withstand snapback under stress conditions is provided by moving the hot spot away from the drain contact region. This is achieved by moving the drain contact region further away from the gate and including an additional n-region next to the drain or an additional floating p-region next to the drain.

8 Claims, 2 Drawing Sheets

SELF PROTECTING NLDMOS, DMOS AND EXTENDED VOLTAGE NMOS DEVICES

FIELD OF THE INVENTION

The present invention deals with ESD protection devices. In particular, it deals with active self protection devices.

BACKGROUND OF THE INVENTION

Numerous devices have been developed for handling electrostatic discharge (ESD) events. These ESD protection devices may be categorized as falling into two groups: the active devices that work in normal operating mode, and the snapback devices which are designed to be triggered and operate in snapback mode during an ESD event and then turn off again as voltage drops below the holding voltage of the device.

The present invention deals with active devices. These are typically larger than snapback devices but have the advantage of being usable as self-protecting devices, where they are functional even during non-ESD situations. While these devices typically are meant not to go into snapback, local overstresses due to current crowding can cause these devices to go into snapback, thereby damaging the device. Typically the margin is rather small before the devices go into snapback. This problem is exacerbated by the fact that the snapback voltage is dependent on gate bias and in practice high-voltage devices used for voltage regulation to provide a low voltage to internal circuits are often not directly connected to the power pad and ground. Thus they fail to provide local clamping of the high voltage pad and ground. Hence the importance for a self-protecting DMOS device.

One such prior art device is the drain extended MOS (DeMOS), sometimes also called an NLDMOS shown in cross-section in FIG. 1, which includes an n-epitaxial layer 100 in which an n-well 102 is formed. In the case of a BiCMOS process an n-buried layer (NBL) 103 may also be formed in the n-epi 100. An n+ drain 104 is formed in the n-well 102, and an n+ source 106 is formed in a p-well 108 in the n-epi 100. A polysilicon gate 110 is formed on top of the n- and p-wells 102, 108, the extended portion of the gate 110 being isolated from the n-well 102 by an isolation oxide 112. As shown in FIG. 1, the drain 104 includes a drain contact 114, the source 106 includes a source contact 116, and the gate 110 includes a gate contact 120. TCAD simulation results indicate that during a stress event such as an ESD event, the hot spot is located near the drain contact, as shown by the region 130 in FIG. 1. While the contact can supply unlimited current, the device has a rather low critical temperature at which irreversible melting-like changes occur. Thus, a single snapback turn-on is fatal for the device.

FIG. 2 shows another prior art device in cross-section, namely an NLDMOS-SCR. This device includes an n-epitaxial layer 200 grown on a p- substrate 201. An n-well 202 is formed in the n-epi 200. In the case of a BiCMOS process an n-buried layer (NBL) 203 may also be formed in the n-epi 200. In the n-epitaxial layer 200, an n+ drain 204 is formed, and an n+ source 206 is formed in a p-well 208 in the n-epi 200. A polysilicon gate 210 is formed on top of the n- and p- wells 202, 208, the extended portion of the gate 210 being isolated from the n- well 202 by an isolation oxide 212. As shown in FIG. 2, the drain 204 includes a drain contact 214, the source includes a source contact 216, and the gate 210 includes a gate contact 220. Unlike the NLDMOS of FIG. 1, this NLDMOS-SCR further includes a p-emitter region 222 formed under the drain contact. This device functions well insofar as it moves the hot spot (shown by region 130) away from the drain contact 214. However, the inclusion of the p-emitter region 222 introduces additional process steps that are typically not required for the devices it supports. Also, the inclusion of the p- emitter region 222 results in a significant saturation NWELL resistor. Thus, the device on-state current is rather low since only the bottom portion of the NWELL under the p-emitter 222 can conduct the current.

The present invention seeks to provide an alternative solution for devices that do not only operate well during normal mode but are also capable of surviving a snapback scenario.

SUMMARY OF THE INVENTION

According to the invention there is provided a method improving the ESD handling capabilities of NLDMOS, DMOS and NMOS devices (both extended voltage and low voltage devices) by moving the maximum power generation region away from the drain contact region of the device. This is achieved by moving the drain contact region further from the gate of the device and introducing an additional n- or p- region into the current path between the drain contact region and the gate. The drain contact region may be moved further from the gate by forming an extended oxide region under the drain contact that isolates a substantial portion of the drain contact. In the case of an additional p-region, the p-region is typically a floating region. In the case of an additional n-region, the n-region may take the form of a drain ballasting region, i.e., an unsilicided portion of the drain. In the case of a BiCMOS process, the n-region may instead be formed using the subcollector regions from the BJT part of the BiCMOS process, i.e. by forming an n-sinker and optionally also an NBL (n-buried layer).

Further, according to the invention, there is provided an NLDMOS, DMOS or NMOS device comprising a gate, a drain with a drain contact defining a drain contact region where the drain contact is in contact with the drain, and an additional n- region or p- region between the drain contact region and the gate, wherein part of the drain contact is isolated from the drain to increase the distance between the drain contact region and the gate. The part of the drain contact may be isolated from the drain by an oxide region under the drain contact. In the case where the additional region is a p-region it may be a floating region. In the case where the additional region is an n- region, it may take the form of a drain ballasting region. In the case of a BiCMOS process, the additional n-region may be formed using the subcollector regions from the BJT part of the BiCMOS process. Thus the additional n-region may comprise an n-sinker and optionally also an NBL (n-buried layer).

DETAILED DESCRIPTION OF THE INVENTION

Figure 3:
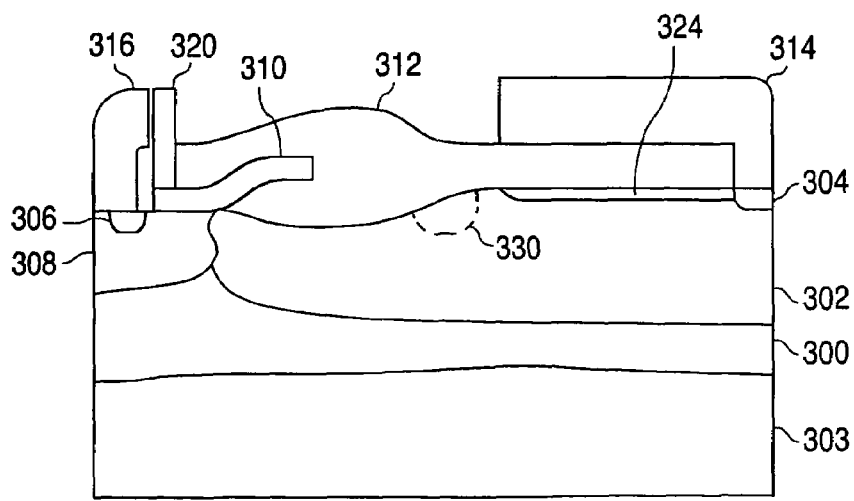
FIG. 3 a cross-section through one embodiment of an NLDMOS device of the invention.

One embodiment of the invention is show in FIG. 3, which provides for the inclusion of an additional n-type ballasting region in order to move the hot spot away from the drain during a stress event such as an ESD event.

Figure 1:
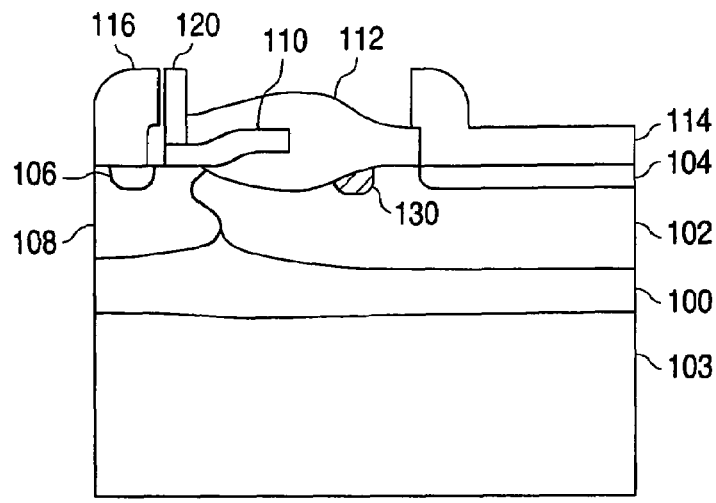
FIG. 1 shows a cross-section through a prior art NLDMOS device.
Figure 2:
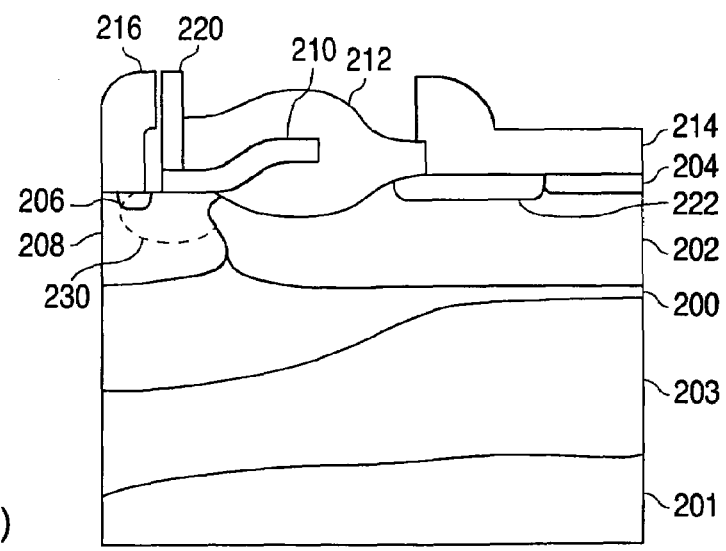
FIG. 2 a cross-section through a prior art NLDMOS-SCR device.

The NLDMOS device of FIG. 3 is similar to the prior art device shown in FIG. 1, in that it includes an n-epitaxial layer 300 in which an n-well 302 is formed. In the case of a BiCMOS process an n-buried layer (NBL) 303 may also be formed in the n-epi 300. An n+ drain 304 is formed in the n-well 302, however it is much smaller than in the conventional device of FIG. 1, as discussed further below. An n+ source 306 is formed in a p-well 308 in the n-epi 300. A polysilicon gate 310 is formed on top of the n– and p– wells 302, 308, the extended portion of the gate 310 being isolated from the n-well 302 by an isolation oxide 312. As shown in FIG. 3, the drain 304 includes a drain contact 314, the source 306 includes a source contact 316, and the gate 310 includes a gate contact 320.

However, as can be seen in FIG. 3, the oxide 312 extends further from the gate than in the conventional device of FIG. 1. The oxide 312 is formed to extend under a substantial portion of the drain contact 314, thereby effectively moving the drain contact region (where the drain contact 314 contacts the drain 304) further away from the gate 310. In addition, the present embodiment includes an n-region 324 next to the drain 304. The n-region 324 in this embodiment is formed as an n+ drain ballast region which thus has a doping level higher than that of the n-well 302 but lower than that of the drain 304. TCAD simulation results indicate that during a stress event such as an ESD event, the hot spot 330 is moved away from the drain contact region, as shown in FIG. 3.

In another embodiment making use of an n-region next to the drain, the n– region was formed by making use of the BJT part of the BiCMOS process to form sub-collector regions. In particular, in one embodiment an n-sinker region was formed and in another embodiment an n-sinker and an n-buried layer (NBL) was formed.

Figure 4:
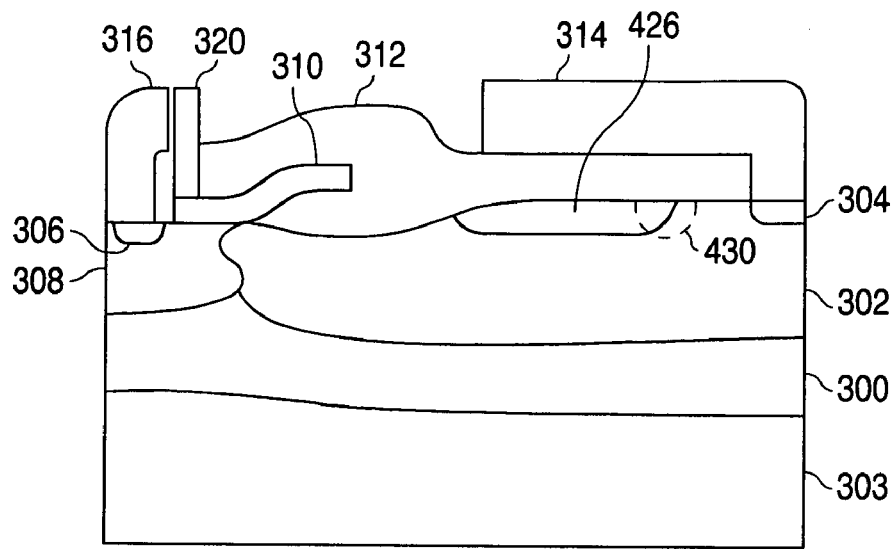
FIG. 4 a cross-section through another embodiment of an NLDMOS device of the invention.

Yet another embodiment of the invention is shown in FIG. 4. In this embodiment, instead of adding an n-region next to the drain, a floating p-region is formed next to the drain. Since many of the other structural elements are the same as in the embodiment of FIG. 4, the same numerals have been used for similar structural elements. In particular, the device of FIG. 4 includes an n– epitaxial layer 300 in which an n-well 302 is formed. In the case of a BiCMOS process an n-buried layer (NBL) 303 may also be formed in the n-epi 300. An n+ drain 304 is formed in the n-well 302, however, as in the FIG. 3 embodiment, it is much smaller than in the conventional device of FIG. 1. An n+ source 306 is formed in a p-well 308 in the n-epi 300. A polysilicon gate 310 is formed on top of the n– and p– wells 302, 308, the extended portion of the gate 310 being isolated from the n-well 302 by an isolation oxide 312. As shown in FIG. 4, the drain 304 includes a drain contact 314, the source includes a source 306 contact 316, and the gate 310 includes a gate contact 320.

However, as can be seen in FIG. 4, the oxide 312 (as was the case in the FIG. 3 embodiment) extends further from the gate than in the conventional device of FIG. 1. The oxide 312 is formed to extend under a substantial portion of the drain contact 314, thereby effectively moving the drain contact region (where the drain contact 314 contacts the drain 304) further away from the gate 310. In addition, the present embodiment includes a floating p-region 426 at the surface, next to the drain 304 instead of an n-region next to the drain 304. Again the hot spot 430 is moved away from the drain contact region.

Simulation results indicate that the absolute maximum temperature of devices including the n-region or floating p-region next to the drain does not change much relative to the conventional devices, however the location of the hot spot is shifted away from the drain contact. Simulation results indicate that critical temperature for device destruction is as much as 500 degrees C. lower in the case of devices where the hot spot is near the drain contact.

Figure 5:
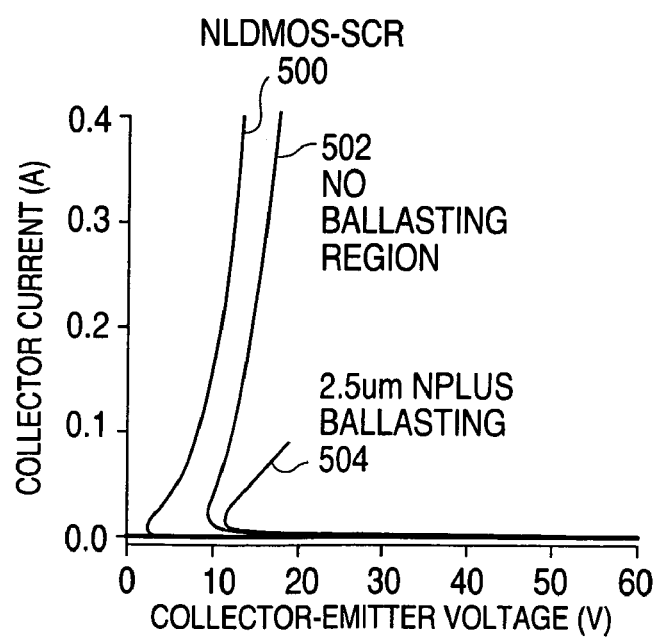
FIG. 5 shows collector current versus collector-emitter voltage graphs for prior art devices compared to one embodiment of the invention.

Also current saturation is significantly improved by the present invention to reduce local current filamentation, as shown by the simulation results of FIG. 5. The collector current vs. collector-emitter voltage curves for a conventional NLDMOS-SCR (curve 500), and a conventional NLDMOS (curve 502) are shown compared to a device of the invention having a 2.5 um n+ ballasting region next to the drain (curve 504).

While specific embodiments of the invention were discussed above, it will be appreciated that the invention is not limited to these embodiments and that other embodiments could be used without departing from the scope of the invention as defined in the claims.

What is claimed is:

1. A method of improving the ESD handling capabilities of NLDMOS, DMOS and NMOS devices, which devices include a gate and a drain contact defining a drain contact region where the drain contact is in contact with a drain, the method comprising moving the maximum power generation region away from the drain contact region of the device, by moving the drain contact region further from the gate of the device by forming an extended oxide region under the drain contact that isolates a substantial portion of the drain contact, and introducing an additional n– region into the current path between the drain contact region and the gate wherein the additional n– region takes the form of a drain ballasting region.

2. A method of improving the ESD handling capabilities of NLDMOS, DMOS and NMOS devices, which devices include a gate and a drain contact defining a drain contact region where the drain contact is in contact with a drain, the method comprising moving the maximum power generation region away from the drain contact region of the device, by moving the drain contact region further from the gate of the device by forming an extended oxide region under the drain contact that isolates a substantial portion of the drain contact, and introducing an additional n– region into the current path between the drain contact region and the gate wherein in the case of a BiCMOS process, the n-region is formed using the subcollector regions from the BJT part of the BiCMOS process.

3. A method of claim 2, wherein the n-region is formed by forming an n-sinker and optionally also an NBL (n-buried layer).

4. An NLDMOS, DMOS or NMOS device comprising,
a gate,
a drain with a drain defining a drain contact region where the drain contact is in contact with the drain, and
an additional n-region or p-region between the drain contact region and the gate, wherein part of the drain contact is isolated from the drain to increase the distance between the drain contact region and the gate, wherein part of the drain contact is isolated from the drain by an oxide region under the drain contact.

5. A device of claim 4, wherein the additional p-region is a floating region.

6. A device of claim 4, wherein the additional n-region takes the form of a drain ballasting region.

7. A device of claim 4, wherein in the case of a BiCMOS process, the addition n-region is formed using the subcollector regions form the BJT part of the BiCMOS process.

8. A method of claim 7, wherein the additional n-region comprises an n-sinker and optionally also an NBL (n-buried layer).

* * * * *